United States Patent [19]

Tada et al.

[11] Patent Number: 4,983,908
[45] Date of Patent: Jan. 8, 1991

[54] PROBING CARD FOR WAFER TESTING AND METHOD OF MANUFACTURING THE SAME

[75] Inventors: Tetsuo Tada; Ryouichi Takagi, both of Hyogo, Japan

[73] Assignee: Mitsubishi Denki Kabushiki Kaisha, Tokyo, Japan

[21] Appl. No.: 501,463

[22] Filed: Mar. 30, 1990

[30] Foreign Application Priority Data

Oct. 11, 1989 [JP] Japan ................................. 1-264150

[51] Int. Cl.[5] .......................... G01R 1/06; G01R 31/07
[52] U.S. Cl. ................................ 324/158 P; 324/72.5; 324/158 F
[58] Field of Search ............... 324/158 P, 158 F, 72.5, 324/73.1

[56] References Cited

U.S. PATENT DOCUMENTS 4,851,767  7/1989  Halbout et al. ................. 324/158 P

FOREIGN PATENT DOCUMENTS 0189949  9/1985  Japan .............................. 324/158 P
0010536  1/1988  Japan .............................. 324/158 P
63-263738 10/1988  Japan .
1-39559  2/1989  Japan .

OTHER PUBLICATIONS

L. Younkin, "Thin-Film-Hybrid Wafer-Probe Card Promises Speed and Density", Electronics Test (May 1989), pp. 26–30.
B. Leslie and F. Matta, "Membrane Probe Card Technology (The Future for High Performance Wafer Test)", 1988 International Test Conference, Paper 30.1, pp. 601–607.
Tektronix Preliminary Performance Information, "P6521, P6522, P6523 Very High Density Probe Cards for VLSI Testing Applications".

Primary Examiner—Ernest F. Karlsen
Attorney, Agent, or Firm—Lowe, Price, LeBlanc, Becker & Shur

[57] ABSTRACT

A probing card for wafer testing has a plurality of probes arranged so as to correspond to and come in contact with a plurality of bonding pads of semiconductor devices fabricated on a semiconductor wafer. The probing card comprises a base plate, contact fingers and wiring sections. The base plate is formed of photosensitive glass. The base plate defines through holes extending from one of its main surfaces to the other. The contact fingers are formed as columnar elements filling the through holes and having a cross-sectional area decreasing from opposite ends to an intermediate position thereof. Each contact finger has one end thereof projecting from one of the main surfaces of the base plate. This projecting end of each contact finger at least defines a substantially planar end face. The wiring sections comprise conductive layers formed in a predetermined pattern on the other main surface of the base plate and connected respectively to the other ends of the contact fingers. The through holes are formed in the photosensitive glass base plate by photolithography. The contact fingers may be positioned with high precision relative to a plurality of bonding pads. A stable contact is secured between the bonding pads and contact fingers.

8 Claims, 9 Drawing Sheets

PROBING CARD FOR WAFER TESTING AND METHOD OF MANUFACTURING THE SAME

CROSS REFERENCE TO RELATED APPLICATION

This application is related to copending application Ser. No. 380,427 filed on July 17, 1989 and commonly assigned with the present invention.

BACKGROUND OF THE INVENTION

1. Field of the Invention

The present invention relates to a probing card for wafer testing and, more particularly, to a probing card for wafer testing having a plurality of probes arranged so as to correspond to and be in contact with a plurality of electrodes of a semiconductor device (semiconductor chip) fabricated on a semiconductor wafer.

2. Description of the Background Art

Figure 5:
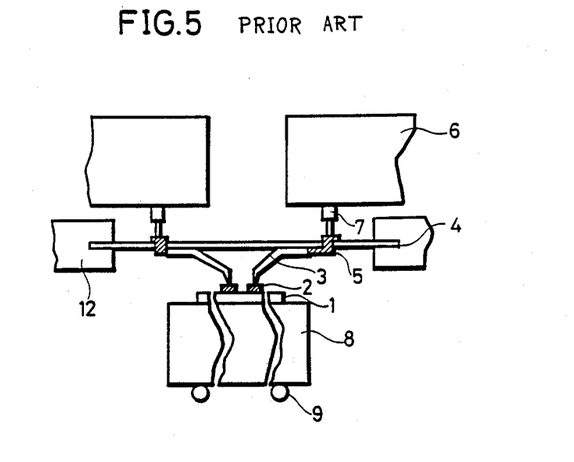
FIG. 5 is a sectional view schematically showing a wafer prober employing a conventional probing plate for wafer testing.
Figure 6:
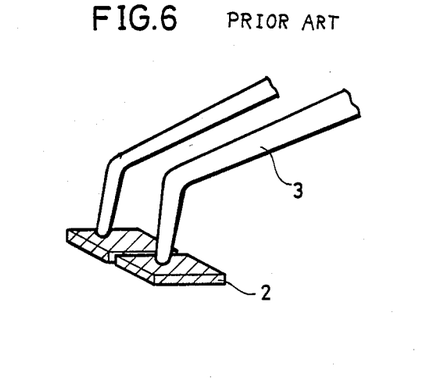
FIG. 6 is an enlarged fragmentary perspective view showing probes in FIG. 5.

Generally, a checking equipment (hereinafter referred to as "wafer prober") is used for measuring electrical characteristics of a semiconductor device formed on a semiconductor wafer in a semiconductor integrated circuit (IC) manufacturing process. This wafer prober employs a probing plate formed by fixedly arranging probes in a pattern corresponding to that of the electrodes, i.e. bonding pads, of the semiconductor device on an insulting holding plate. FIG. 5 is a sectional view schematically showing a conventional probing plate for wafer testing incorporated into a wafer prober. FIG. 6 is an enlarged fragmentary perspective view showing slender electrical leads (hereinafter referred to as "probes") in contact with bonding pads on a wafer. A conventional LSI tester for wafer testing will be described with reference to these drawings.

A wafer 1 mounted with a plurality of semiconductor devices, such as LSIs (large-scale integrated circuits) is fixed on a wafer chuck 8. The wafer chuck 8 can be moved vertically and horizontally by a moving mechanism 9. A large number on the order of several hundreds of bonding pads 2 are formed on the upper surface of the wafer 1 for each semiconductor chip. Slender probes 3 are arranged and held on a probe holding plate 4 so as to correspond to the bonding pads 2, respectively. The probe holding plate is positioned above the wafer 1. The probes 3 are formed of tungsten, chromium or a tungsten-chromium alloy. The probe holding plate 4 is formed of an insulting material, such as glass or epoxy resin. A conductive pattern of metallic wiring lines 5 is formed on the probe holding plate 4. This conductive pattern 5 is formed of copper, for example. The probes 3 are connected electrically to the conductive pattern 5 by soldering or the like. The size of the contact area of the electrode pads 2 with which the tip of the probe 3 is brought into contact is in the range of about 50 to 100 μm in diameter. The external diameter of the base of the probe 3 connected to the probe holding plate 4 is in the range of about 150 to 200μm. A conductive pattern 5, which is the same as the conductive pattern 5 connected to the probes 3, is formed on the other surface of the probe holding plate 4 and is connected via through holes to the former conductive pattern 5. The conductive pattern 5 is in electrical contact with contact pins (hereinafter referred to as "pogo pins") 7 provided on the test head 6 of an LSI tester. The probe holding plate 4 is held fixedly on a plate holding member 12.

The testing procedure using the probing plate (or probing card) for testing the electrical characteristics of semiconductor devices on a wafer will be described hereinafter. The position of the wafer chuck 8 is adjusted by the moving mechanism 9 so that the bonding pads 2 of one or a plurality of semiconductor devices formed on the wafer 1 are brought into positions opposed respectively to the corresponding probe 3 fixed on the probe holding plate 4. The wafer chuck 8 is moved vertically so that the surfaces of the bonding pads 2 are in appropriate contact with the corresponding probes 3, respectively. Consequently, the semiconductor devices formed on the wafer 1 are connected electrically through the conductive patterns 5 and the pogo pins 7 of the test head to the LSI tester for signal transmission between the semiconductor devices on the wafer 1 and the LSI tester for testing the electrical characteristics of the semiconductor devices assembled on the wafer 1.

However, since the conventional probing plate for wafer testing employs probes, the diameter of the probes must be reduced according to a reduction in the size and pitch of the bonding pads formed on the wafer, which entails an increase in the contact resistance between the boding pads and the probes. Furthermore, difficulty in manufacturing the probes and in mounting the probes in the probe holding plate is enhanced as the diameter of the probes is reduced. That is, a reduction in the size of probes makes it difficult to accurately attach a plurality of minute probes to the probe holding plate so that the probes can be highly accurately positioned relative to a plurality of bonding pads formed on the wafer by precision processes.

Figure 7:
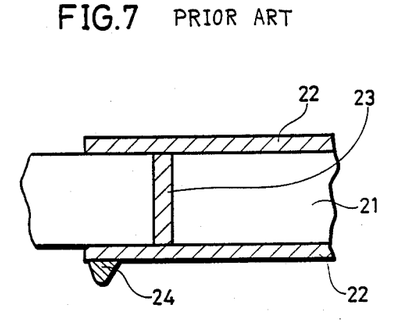
FIG. 7 is a fragmentary sectional view showing a probe of a probing card according to the prior art.

Japanese Patent Laying-Open No. 63-263738 discloses a probing card with improved precision for positioning wafer testing probes to solve the foregoing problems. FIG. 7 is a fragmentary sectional view showing a probe portion of such a probing card. This probing card comprises an insulating base plate 21 carrying conductive patterns 22 formed on both surfaces thereof. These conductive patterns 22 are electrically interconnected through conductors 23 formed in through holes. A bump 24 is formed on each conductive pattern 22 on one surface of the base plate 21. The conductive patterns 22 are formed by etching copper foil applied to the base plate 21. The bumps 24 are formed of gold.

According to the above probing card, the bumps 24 are formed on extreme ends of the conductive patterns 22 to act as probes. Consequently, a high precision for positioning the probe portion may be secured by designing the conductive patterns 22 in accordance with positions of electrodes or bonding pads to be measured. However, the probe portion, because of the bump shape, makes a contact with each bonding pad in the form of a point contact. Such a contact between the bump 24 and the bonding pads cannot be a stable contact. When the bumps 24 are given in an increased height so that the bumps 24 alone will reliably come in contact with the surfaces of the bonding pads, the bumps 24 must extend across the conductive patterns 22 because of the shaping condition. Consequently, even if the conductive patterns 22 may be formed with niceties, it is difficult, because of the limitation imposed by the bump shape, to form the probe portion with desired minute spacing and high density.

Figure 8:
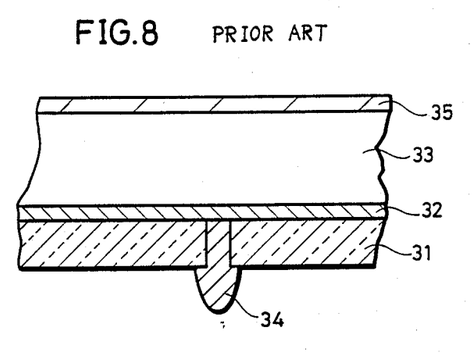
FIG. 8 is a fragmentary sectional view showing a probe of a different probing card according to the prior art.

Japanese Patent Laying-Open No. 64-39559 discloses a different probing card with improved precision for positioning wafer testing probes. FIG. 8 is a fragmentary sectional view showing a probe portion of such a probing card. This probing card comprises a transparent base plate 31 fixedly carrying probes 34 formed of a conductive elastic material for coming in contact with the bonding pads of each chip formed on a semiconductor wafer. The base plate 31 further carries conductive wiring layers 32 connected to the probes 34. On the conductive layers 32 are compressed gas filled layers 33 surrounded by partitions 35 formed of a transparent material. A high pressure gas filled into the layers 33 applies a pressure to the probes 34. This assures an excellent contact between the probes 34 and the bonding pads. That is, a uniform probe pressure is applied to the respective bonding pads.

According to the above probing card, however, the probes 34 are bump-shaped and are placed in through holes of the base plate 31 for connection to the conductive layers 32. Such a limitation to the shape of the probes is obstructive to a stable contact between the bonding pads and probes. This is because the contact between the bonding pads and probes takes the form of a point contact having a small contact area. In order for only the tip faces of the probes 34 to come in contact with the bonding pads reliably, the tip faces must be located remote from the surface of the base place 31. If this is realized by increasing the height of the probes 34, the probes 34 are inevitably formed to extend transversely on the surface of the base plate 31. This makes it difficult of form the probes 34 with desired minute spacing and high density. Besides, the probes 34 are connected to the conductive layers 32 via the through holes. The probes 34 are repeatedly pressurized for one measurement after another. It is therefore possible for the probes 34 shaped as shown in FIG. 8 to slip downwardly out of the through holes.

SUMMARY OF THE INVENTION

It is an object of the present invention to position a plurality of probes with high precision relative to a plurality of bonding pads by using probing card for wafer testing.

It is another object of the present invention to have minute probes in a probing card for wafer testing.

It is a further object of the present invention to have a probe construction capable of a stable contact with bonding pads in a probing card for wafer testing.

It is a still further object of the present invention to prevent probes formed in through holes from slipping vertically out of the through holes in a probing card for wafer testing.

It is a different object of the present invention to manufacture a probing card for wafer testing having a plurality of probes which may be positioned with high precision relative to a plurality of bonding pads.

It is yet another object of the present invention to manufacture a probing card for wafer testing having minute probes with ease.

It is a further object of the present invention to manufacture a probing card for wafer testing having a probe construction capable of a stable contact with bonding pads.

It is a still further object of the present invention to manufacture a probing card for wafer testing having a construction effective to prevent probes formed in through holes from slipping vertically out of the through holes.

A probing card for wafer testing according to the present invention has a plurality of probes arranged so as to correspond to and come in contact with a plurality of bonding pads of semiconductor devices fabricated on a semiconductor wafer. The probing card for wafer testing comprises a base plate, contact fingers and wiring sections. The base plate has two main surfaces and is formed of a material having electrically insulating, transparent and photosensitive properties. The base plate defines through holes extending from one of the main surfaces to the other. The contact fingers are formed as columnar elements filling the through holes and having a cross-sectional area decreasing from opposite ends to an intermediate position thereof. Each contact finger, which is formed of a conductive material, has one end thereof, projecting from one of the main surfaces of the base plate. This projecting end of each contact finger at least defines a substantially planar end face. The wiring sections comprise conductive layers formed in a predetermined pattern on the other main surface of the base plate and connected respectively to the other ends of the contact fingers.

In a method of manufacturing a probing card for wafer testing according to the present invention, through holes are first formed, by photolithography, in a base plate having two main surfaces and electrically insulating, transparent and photosensitive properties. The through holes extend from one of the main surfaces to the other, with a cross-sectional area thereof decreasing from opposite ends to an intermediate position. Conductive layers are formed to fill the through holes and extend over the main surfaces of the base plate. Only the conductive layers formed on one of the main surfaces of the base plate are removed. Then, portions of the base plate are removed from the one of the main surfaces so that the conductive layers filling the through holes project from the one of the main surfaces of the base plate.

In the present invention, the base plate of the probing card has a photosensitive property. This feature permits the through holes for filling with the contact fingers to be formed with high precision by photolithography. Thus the contact fingers may be arranged at minute intervals and with high density on the base plate. Consequently, it is possible to position the contact fingers with high precision relative to a plurality of bonding pads of semiconductor devices formed with niceties and high density.

The contact fingers fill the through holes formed in the base plate. These contact fingers are formed as columnar elements having a cross-sectional area decreasing from opposite ends to an intermediate position thereof. One end of each columnar element defines a substantially planar end face. Consequently, the contact between each contact finger and the corresponding bonding pad takes the form of a surface contact having a large contacting area. This assures a stable contact between the bonding pads and contact fingers. Further, since the contact fingers have a cross-sectional area decreasing from opposite ends to an intermediate position thereof, the contact fingers are not formed to spread across the base plate even if the contact fingers project to an increased height from one main surface of the base plate. This feature allows the contact fingers to be arranged at minute intervals and with high density on the base plate. Besides, since the contact fingers are formed to have a cross-sectional area decreasing from opposite ends to an intermediate position thereof, the contact fingers do not slip vertically out of the through holes formed in the base plate.

With a probing card for wafer testing in a preferred embodiment of the present invention, the intermediate positions of the columnar elements having a reduced cross-sectional area are exposed from one of the main surfaces of the base plate. Alternatively, the intermediate positions of the columnar elements having a reduced cross-sectional area may be located inside the through holes formed in the base plate. The columnar elements may have a circular cross section. Further, each of the contact fingers may include a body portion formed of a first conductive material, and a portion for coming in contact with the bonding pads which is formed of a second conductive material having a lower electric resistance than the first conductive material.

In a further preferred embodiment of the invention, the step of forming the through holes may include the steps of exposing predetermined regions of the base plate to light, and removing the predetermined regions having been exposed. The step of exposing the predetermined regions of the base plate may include the steps of selectively radiating light to one of the main surfaces of the base plate, and selectively radiating light to the other main surface of the base plate. The step of forming the conductive layers may include the step of successively forming a first conductive layer and a second conductive layer of different materials.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to FIGS. 1A to 1D. Description will be made with reference to these drawings as to the construction of a probing card for wafer testing according to the present invention, and a wafer prober employing this probing card.

Figure 1A:
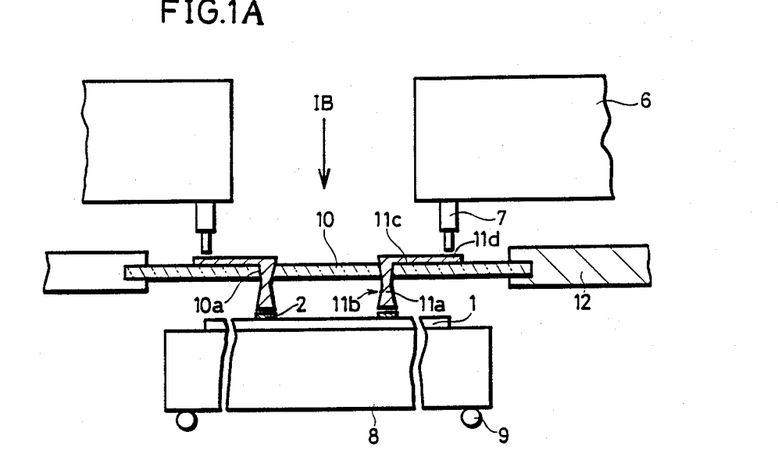
FIG. 1A is a sectional view schematically showing a wafer prober employing a probing card for wafer testing according to the present invention.
Figure 1B:
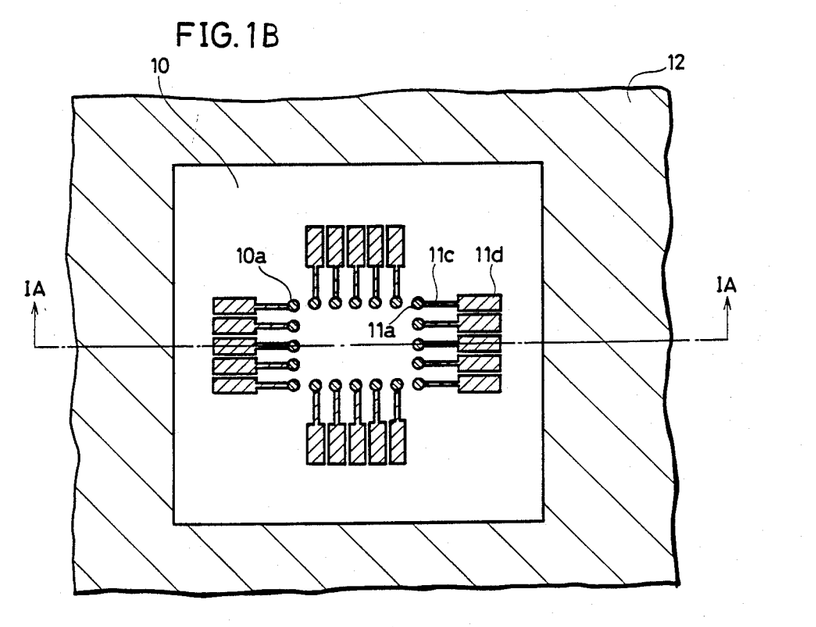
FIG. 1B is a transparent plan view as seen in the direction indicated by an arrow IB in FIG. 1A.
Figure 1C:
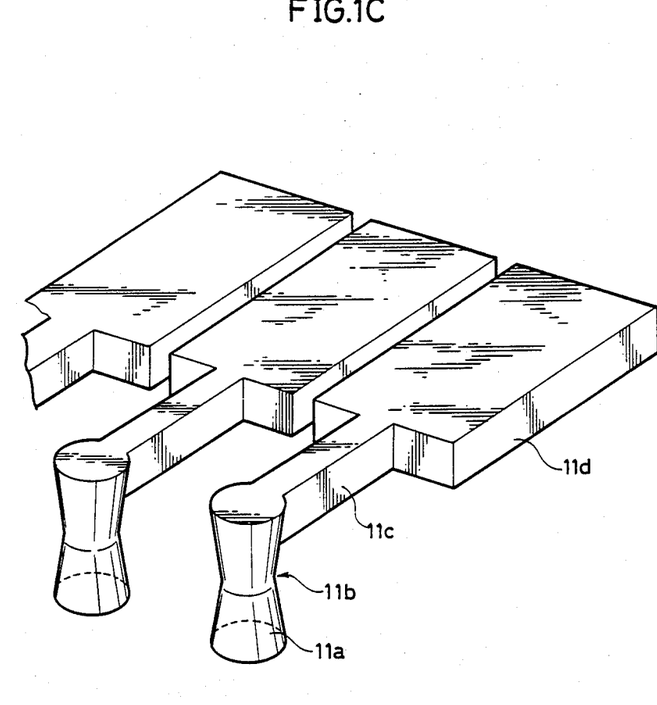
FIG. 1C is an enlarged perspective view showing only a probe portion of the probing card for wafer testing according to the present invention.
Figure 1D:
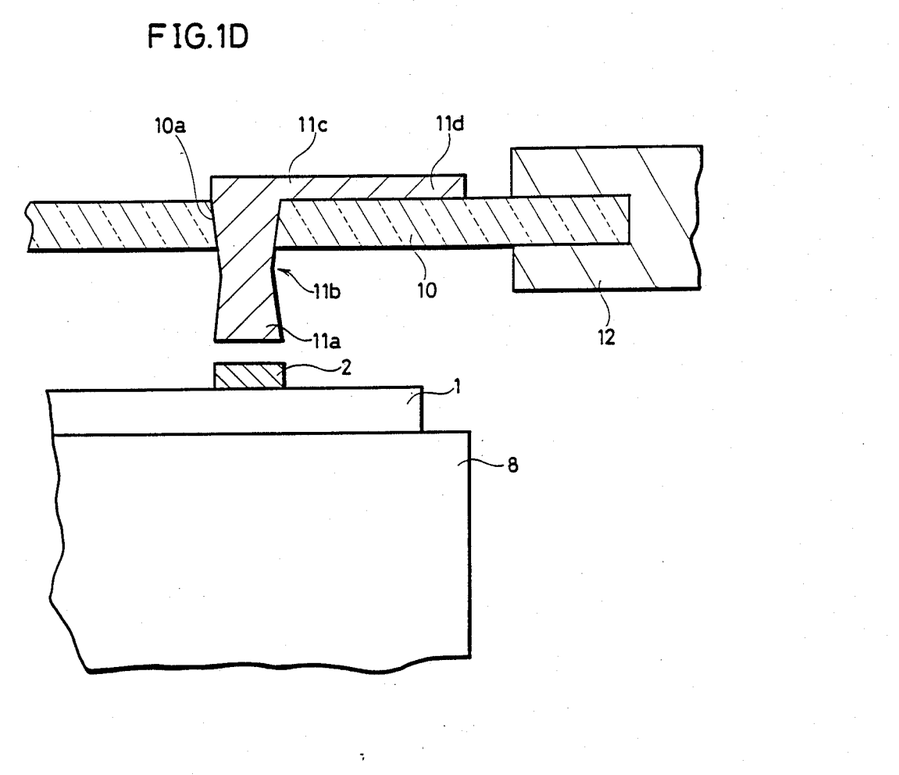
FIG. 1D is an enlarged fragmentary sectional view of the probe portion of FIG. 1A.

With reference to FIGS. 1A and 1B, a base plate 10 formed of photosensitive transparent glass defines hundreds of minute through holes 10a. Only ten-odd through holes 10a are illustrated for simplicity. Each through hole 10a is filled with a contact finger 11a. As shown in FIGS. 1C and 1D, the contact finger 11a is shaped to have a cross-sectional area decreasing from opposite ends toward a constriction 11b at an intermediate position thereof. The contact finger 11a defines a substantially planar surface at one end thereof for coming in contact with an electrode or boding pad 2 formed on a wafer 1 to be tested. The other end of the contact finger 11a extends to the other surface of the base plate 10 of photosensitive transparent glass. Metallic wiring layers 11c, 11d are formed on the other surface of the base plate 10 so as to be connected to the other ends of the respective contact fingers 11a. The contact fingers 11a are arranged at intervals up to about 80μm on the base plate 10. The size of the plane of each contact finger 11a that comes in contact with the bonding pad 2 is on the order of 50μm or less in diameter. The height of each contact finger 11a projecting from the base plate 10 is on the order of 50μm. The cross-sectional area of each contact finger 11a decreases from the opposite ends to the intermediate constriction 11b by about 3 degrees of inclination of its outer periphery. These dimensions are appropriately determined in accordance with the size and pitch of the bonding pads formed on the semiconductor wafer to be tested.

As shown in FIG. 1A, the wafer 1 carrying a plurality of LSIs thereon is fixedly mounted on a wafer chuck 8. The wafer chuck 8 can be moved vertically and horizontally by a moving mechanism 9 to position the bonding pads 2 arranged on the wafer 1 relative to the corresponding contact fingers 11a of the probing card disposed above the wafer chuck 8. The base plate 10 of photosensitive transparent glass supporting the contact fingers 11a as mounted in the through holes 10a is held stationary by a base plate fixing section 12 of the wafer prober. The contact fingers 11a for coming in contact with the bonding pads 2 are connected to the metallic wiring layers 11c. These layers 11c are continuous with the metallic wiring layers 11d electrically connected to pogo pins 7. The pogo pins 7 are attached to the test head 6 of an LSI tester.

In the wafer prober thus constructed, electric signals are transmitted between the semiconductor devices fabricated on the wafer 1, and the LSI tester through the following paths. Each bonding pad 2 is in contact with the contact finger 11a, which in turn is connected electrically to the metallic wiring layer 11c. The wiring layer 11c is continuous with the wiring layer 11d. The wiring layer 11d is connected electrically to the main body of the LSI tester (not shown) through the pogo pin 7 mounted in the test head 6. Of the metallic wiring layers formed on the other surface of the base plate 10 of photosensitive transparent glass, the wiring layer 11d acting as a region for coming in contact with the pogo pin 7, as shown in FIG. 1B, has a larger area than the wiring layer 11c interconnecting the contact finger 11a with the wiring layer 11d. This provides for increased stability of electrical contact between the pogo pins 7 of the LSI tester and the metallic wiring layers. Since the base plate 10 is transparent, the state of contact between the bonding pads 2 and the contact fingers 11a may be confirmed reliably.

Figure 2:
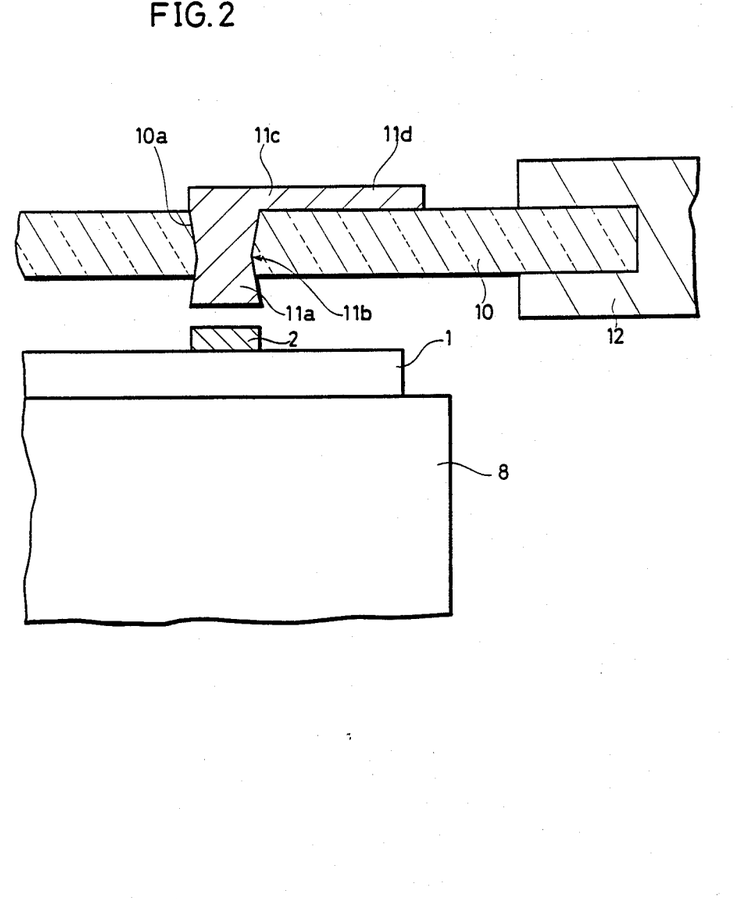
FIG. 2 is a fragmentary sectional view of a probing card for wafer testing in another embodiment of the present invention.

As shown in FIG. 2, the constriction 11b of each contact finger 11a is located inside the through hole 10a of the base plate 10. In this way, the positional relationship between the contact fingers 11a and the base plate 10 may be varied according to the extent to which the contact fingers 11a project from the surface of the base plate 10. It will serve the purpose if at least the constriction 11b is formed on a halfway position of each contact finger 11a so that the contact finger 11a does not readily slip out of the through hole 10a.

Figure 3:
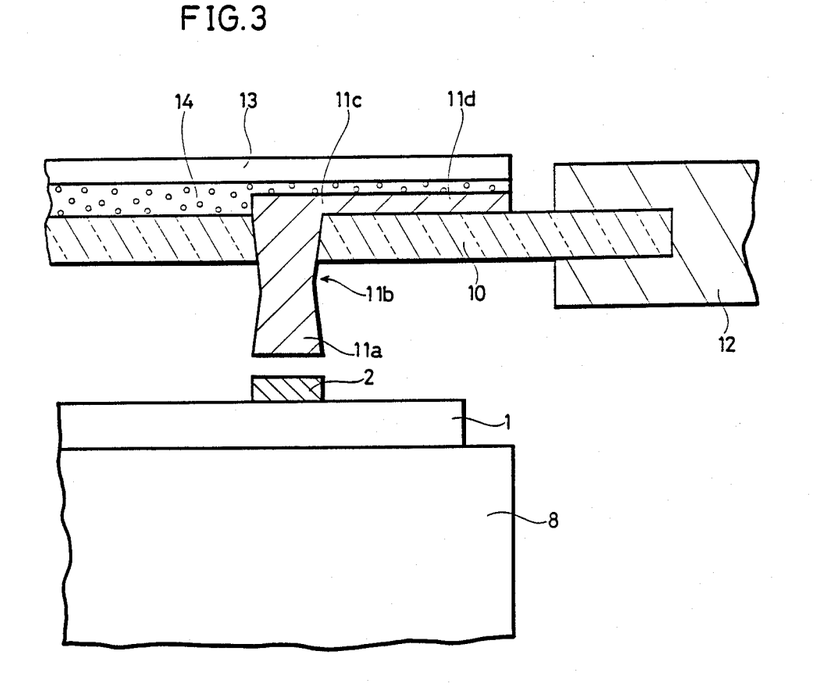
FIG. 3 is a fragmentary sectional view of a probing card for wafer testing in a further embodiment of the present invention.

As shown in FIG. 3, a reinforcing transparent glass plate 13 is bonded to the surface of the base plate 10 of photosensitive transparent glass not opposed to the wafer 1. This reinforcing transparent glass plate 13 is bonded to the base plate 10 and metallic wiring layers 11c and 11d by a transparent adhesive 14 such as a resin. This construction increases the strength of the probing card. Since the base plate 10 of photosensitive transparent glass has a thickness on the order of 0.2 to 0.5 mm, for example, the probing card could break when the contact fingers 11a are brought into contact with the bonding pads 2. The reinforcing transparent glass plate 13 is bonded to the base plate 10 in order to avoid such damage.

A process of manufacturing a probing card for wafer testing will be described next, taking the probing card shown in FIG. 2 for example. By way of exemplifying the manufacturing process, photosensitive glass used as the material for the base plate 10. The process of manufacturing a probing card for wafer testing having one contact finger will be described with reference to FIGS. 4A to 4J.

Figure 4A:
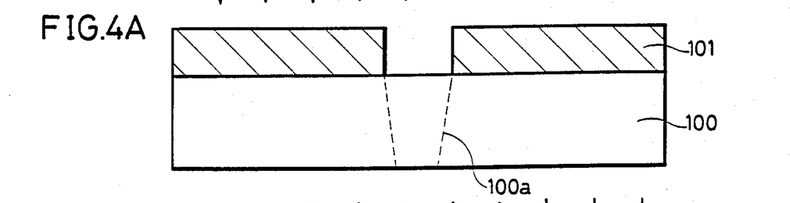
FIGS. 4A, 4B, 4C, 4D, 4E, 4F, 4G, 4H, 4I and 4J are sectional views showing successive stages of a process of manufacturing a probing card according to the present invention.

Referring first to FIG. 4A, a resist mask 101 is formed on a photosensitive glass plate 100 having polished surfaces. Using this mask 101, ultraviolet ray or light is radiated in the direction indicated by arrows. As a result, a latent image forming region 100a is produced in a taper becoming gradually narrower inwardly of the photosensitive glass plate 100. This is due to the intensity of ultraviolet ray or light lessening as it proceeds inwardly of the photosensitive glass plate 100.

Figure 4B:
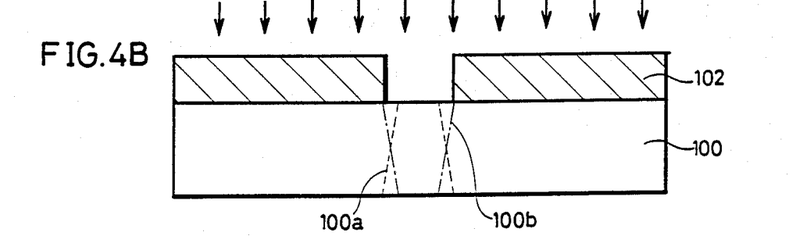

Referring to FIG. 4B next, a mask 102 is formed on the other surface of the photosensitive glass plate 100 in the same way as in FIG. 4A. Using this mask 102, ultraviolet ray or light is radiated in the direction indicated by arrows. As a result, a latent image forming region 100b is produce in the photosensitive glass plate 100, in a taper opposite to the latent image forming region 100a. At this time, the tapered forms of latent image forming regions 100a and 100b have an inclination of about 3 degrees.

Figure 4C:
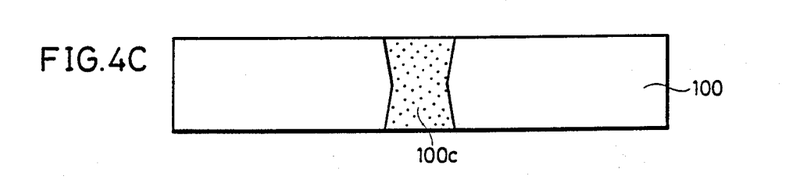

Referring to FIG. 4C, the latent image forming regions 100a and 100b, i.e. only the portions of the photosensitive glass plate 100 having been exposed to light, are crystallized through an appropriate heat treatment. With the heating and developing treatment following the exposure, a metallic colloid is produced to serve as the core for crystallization. The portion 100c thus crystallized is formed to become gradually narrower inwardly from the two main surfaces of the photosensitive glass plate 100.

Figure 4D:
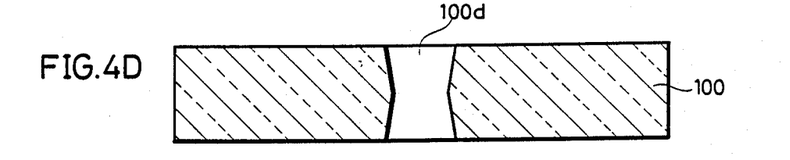

Referring to FIG. 4D, the crystallized portion 100c is dissolved and removed (i.e. etched) with acid. In this way, a bore 100d is formed in the photosensitive glass plate 100 to serve as a through hole for accommodating a contact finger.

Figure 4E:
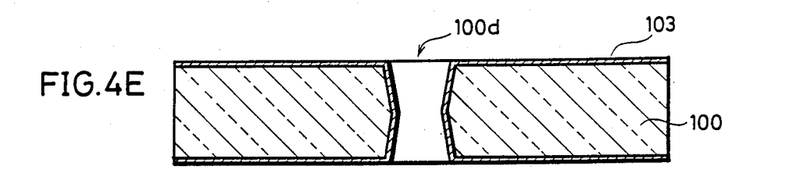

As shown in FIG. 4E, an ITO (Indium Tin Oxide) film is formed in a thickness of 1000 to 2000 Å on wall surfaces of the bore 100d and the two surfaces of the photosensitive glass plate 100 This ITO film 103 is formed by electroless plating.

Figure 4F:
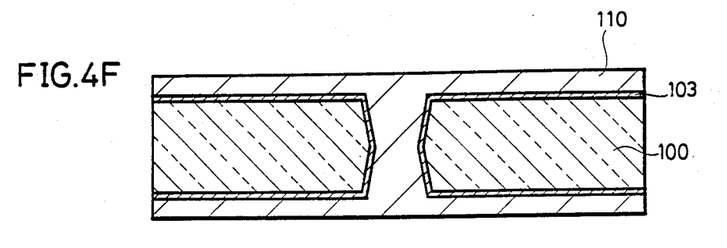

Referring now to FIG. 4F, a nickel plating layer 110 is formed in a thickness of about 4 to 5 $\mu$m over the ITO plating film 103, so as to fill the bore 100d and accumulate on the two surfaces of the photosensitive glass plate 100.

The nickel plating layer 110 is formed by electroless plating on the ITO plating film 103.

Figure 4G:
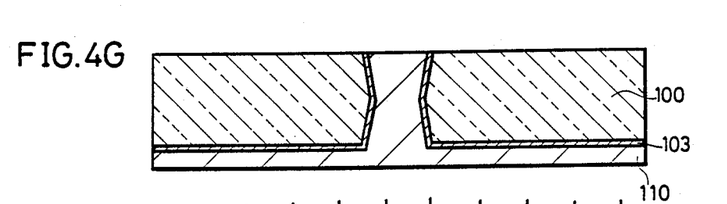

As shown in FIG. 4G, the nickel plating layer 110 and ITO plating film 103 formed on one of the main surfaces of the photosensitive glass plate 100 are removed therefrom by polishing. As a result, one of the main surfaces of the glass plate 100 is exposed.

Figure 4H:
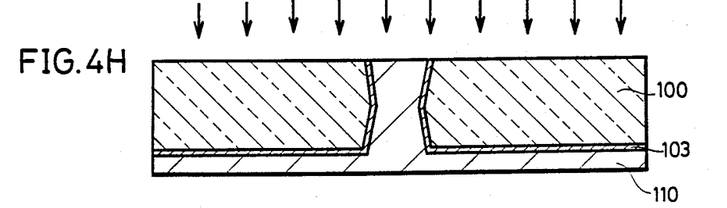

Referring next to FIG. 4H, ultraviolet ray or light is radiated in the direction indicated by arrows, over the entire exposed surface of the photosensitive glass plate 100. As a result, a latent image is formed on the glass plate 100.

Figure 4I:
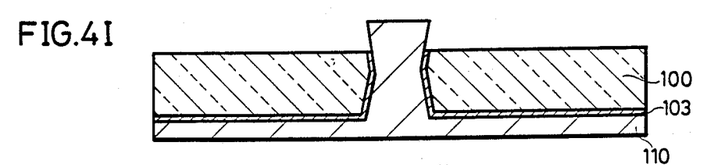

Thereafter, as shown in FIG. 4I, the exposed main surface of the photosensitive glass plate 100 is partly dissolved and removed (i.e. etched) with acid. Consequently, an end of the columnar nickel plating layer 110 projects from one of the main surfaces of the glass plate 100. At this time, the height of the columnar nickel plating layer 110 projecting from that surface of the glass plate 100 is on the order of 50 to 100 $\mu$m. The thickness of the photosensitive glass plate 100 at this time is on the order of 0.2 to 0.5 mm.

Figure 4J:
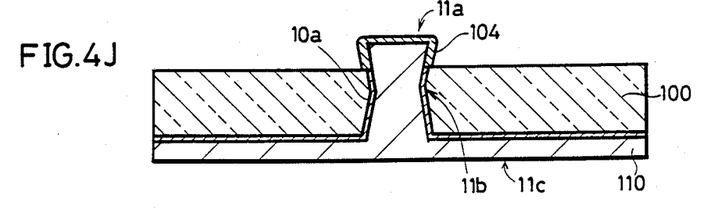

Further, as shown in FIG. 4J, a gold plating layer 104 is formed over the tip end of the contact finger 11a which is to come in contact with a bonding pad. This is provided to prevent oxidation of the surfaces of the nickel plating layer 110. The gold plating layer 104 is formed in a thickness of several thousands Å to several micrometers.

While, in the above embodiments, the contact fingers 11a comprise the gold plating layer and nickel plating layer, the contact fingers 11a may comprise the gold plating layer alone. However, the metallic wiring layers 11c need to have a certain thickness to lower the electric resistance. Therefore, an increased manufacturing cost will be involved where the metallic wiring layers are formed of the gold plating layer alone. Further, nickel plating has strong and stable adhesive characteristics with respect to ITO. It is therefore desirable to use the gold plating layer having a low electric resistance only for the portions that come in contact with the bonding pads and to form the body portions of the contact fingers with the nickel or chromium plating layer As in the foregoing embodiments, the probing cards are formed by a continuous manufacturing process using photolithography. Thus, the contact fingers may be arranged on the base plate with niceties and high precision as integrated with the metallic wiring layers According to the present invention, as described hereinbefore, the contact fingers may be formed for being positioned with high precision relative to a plurality of bonding pads included in LSIs. Such contact fingers have a construction capable of stable contact with the bonding pads. Besides, the contact fingers formed in the through holes are effectively prevented from slipping vertically out of the through holes Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A probing card for wafer testing having a plurality of probes arranged so as to correspond to and come in contact with a plurality of bonding pads of semiconductor devices fabricated on a semiconductor wafer, comprising:
   a base plate having two main surfaces and formed of a material having electrically insulating, transparent and photosensitive properties, said base plate defining through holes extending from one of said main surfaces to the other;
   contact fingers formed of a conductive material as columnar elements extending through and filling said through holes and having a cross-sectional area decreasing from opposite ends to an intermediate position thereof, each of said contact fingers having one end thereof projecting from one of said main surfaces of said base plate, at least said one end defining a substantially planar end face; and
   conductive wiring layers formed in a predetermined pattern on the other main surface of said base plate and connected respectively to the other ends of said contact fingers.

2. A probing card for wafer testing according to claim 1, wherein said intermediate positions of the columnar elements having a reduced cross-sectional area are exposed from said one of the main surfaces of said base plate.

3. A probing card for wafer testing according to claim 1, wherein said intermediate positions of said columnar elements having a reduced cross-sectional area are located inside said through holes formed in said base plate.

4. A probing card for wafer testing according to claim 1, wherein said columnar elements have a circular cross section.

5. A probing card for wafer testing according to claim 1, wherein each of said contact fingers includes a body portion formed of a first conductive material, and a portion for coming in contact with said bonding pads which is formed of a second conductive material having a lower electric resistance than said first conductive material.

6. A probing card for wafer testing according to claim 5, wherein said first conductive material is nickel, and said second conductive material is gold.

7. A probing card for wafer testing according to claim 1, further comprising a reinforcing plate having transparent and insulating properties and bonded to the other main surface of said base plate.

8. A probing card for wafer testing according to claim 1, wherein said base plate is formed of glass.

* * * * *